United States Patent
Kitamura

(10) Patent No.: US 11,889,618 B2
(45) Date of Patent: Jan. 30, 2024

(54) WIRING BOARD, ELECTRONIC COMPONENT PACKAGE, AND ELECTRONIC APPARATUS

(71) Applicant: KYOCERA Corporation, Kyoto (JP)

(72) Inventor: Toshihiko Kitamura, Omihachiman (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 17/605,162

(22) PCT Filed: Apr. 27, 2020

(86) PCT No.: PCT/JP2020/017957
§ 371 (c)(1),
(2) Date: Oct. 20, 2021

(87) PCT Pub. No.: WO2020/218608
PCT Pub. Date: Oct. 29, 2020

(65) Prior Publication Data
US 2022/0217834 A1    Jul. 7, 2022

(30) Foreign Application Priority Data
Apr. 25, 2019  (JP) .................................. 2019-084011

(51) Int. Cl.
*H05K 7/10*  (2006.01)
*H05K 1/02*  (2006.01)

(52) U.S. Cl.
CPC ........... *H05K 1/024* (2013.01); *H05K 1/0243* (2013.01); *H05K 1/0246* (2013.01); *H05K 2201/1034* (2013.01); *H05K 2201/10886* (2013.01)

(58) Field of Classification Search
CPC ...... H05K 7/06; H05K 7/1015; H05K 7/1053; H05K 13/024; H05K 2201/10742; H05K 2201/10886; H05K 1/024; H05K 1/0243; H05K 1/0246
See application file for complete search history.

(56) References Cited

U.S. PATENT DOCUMENTS 5,736,784 A * 4/1998 Dove ...................... H01L 24/48
257/E23.068
6,220,765 B1 * 4/2001 Tatoh .................. H01L 31/0203
385/94

(Continued)

FOREIGN PATENT DOCUMENTS

| JP | 04-130760 A | 5/1992 |
| JP | 04130761 A * | 5/1992 |
| JP | 2004-134614 A | 4/2004 |

*Primary Examiner* — Hoa C Nguyen
(74) *Attorney, Agent, or Firm* — Volpe Koenig

(57) ABSTRACT

A dielectric substrate has a first surface including a first terminal joint and a second terminal joint arranged along a first side surface. A first lead terminal is bonded to the first terminal joint with a bond. A second lead terminal is bonded to the second terminal joint with a bond. The first lead terminal includes a first base bonded to the first terminal joint and a first lead extending from the first base. The second lead terminal includes a second base bonded to the second terminal joint and a second lead extending from the second base. The first lead terminal includes the first base having a larger thickness than the first lead.

17 Claims, 9 Drawing Sheets

(56) References Cited

U.S. PATENT DOCUMENTS

| | | | | |
|---|---|---|---|---|
| 6,381,066 B1* | 4/2002 | Korn | .................... | H01S 5/02251 |
| | | | | 359/344 |
| 6,541,702 B2* | 4/2003 | Miyaki | ............. | H01L 23/49541 |
| | | | | 29/841 |
| 7,502,399 B2* | 3/2009 | Ferstl | ................. | H01S 5/02216 |
| | | | | 372/65 |
| 2003/0178711 A1* | 9/2003 | Honda | ................... | H01S 5/0231 |
| | | | | 257/676 |
| 2014/0124912 A1* | 5/2014 | Kaneda | .................... | H01L 24/49 |
| | | | | 257/676 |
| 2017/0025331 A1* | 1/2017 | Kamiyama | ........ | H01L 23/49562 |
| 2018/0047714 A1* | 2/2018 | Feng | .................... | H01L 23/3675 |
| 2018/0269132 A1* | 9/2018 | Kamiyama | ............ | H01L 23/481 |
| 2018/0366425 A1* | 12/2018 | Kondo | ................ | H01L 23/4985 |
| 2020/0136121 A1* | 4/2020 | Allen | ................. | H01M 50/562 |

* cited by examiner

WIRING BOARD, ELECTRONIC COMPONENT PACKAGE, AND ELECTRONIC APPARATUS

FIELD

The present invention relates to a wiring board, an electronic component package, and an electronic apparatus.

BACKGROUND

As electronic devices including mobile phones are widespread, these devices use electric signals with higher frequencies to transmit larger volumes of information at higher speeds. For better frequency response at high frequencies, packages containing semiconductor devices may include lead terminals with tapered ends, or ends gradually thinner toward their tips, for connection to wiring (refer to, for example, Patent Literature 1).

CITATION LIST

Patent Literature

Patent Literature 1: Japanese Unexamined Patent Application Publication No. 2004-134614

BRIEF SUMMARY

A wiring board according to an aspect of the present disclosure includes a dielectric substrate, a first lead terminal, and a second lead terminal. The dielectric substrate has a first surface, a second surface opposite to the first surface, and a first side surface continuous with the first surface and the second surface. The first surface includes a first terminal joint and a second terminal joint arranged along the first side surface. The first lead terminal includes a first base bonded to the first terminal joint and a first lead extending from the first base. The second lead terminal includes a second base bonded to the second terminal joint and a second lead extending from the second base. The first base has a larger thickness than the first lead.

An electronic component package according to another aspect of the present disclosure includes a substrate, and the wiring board according to the above aspect bonded to the substrate.

An electronic apparatus according to still another aspect of the present disclosure includes the electronic component package according to the above aspect, and an electronic component mounted on the substrate and electrically connected to the wiring board.

BRIEF DESCRIPTION OF DRAWINGS

The objects, features, and advantages of the present disclosure will become more apparent from the following detailed description and the drawings.

DETAILED DESCRIPTION

Figure 1:
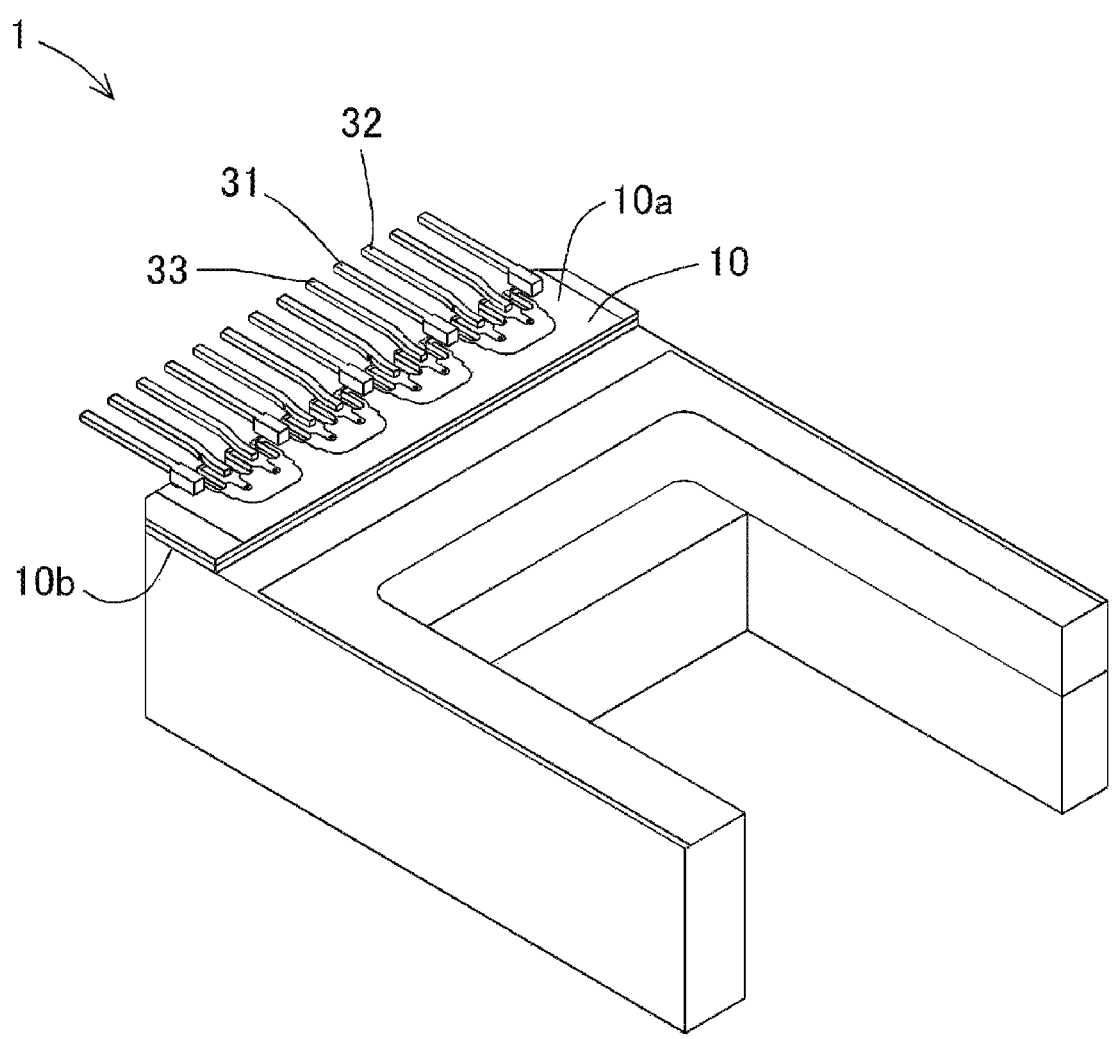
FIG. 1 is a perspective view of a wiring board according to a first embodiment.
Figure 2:
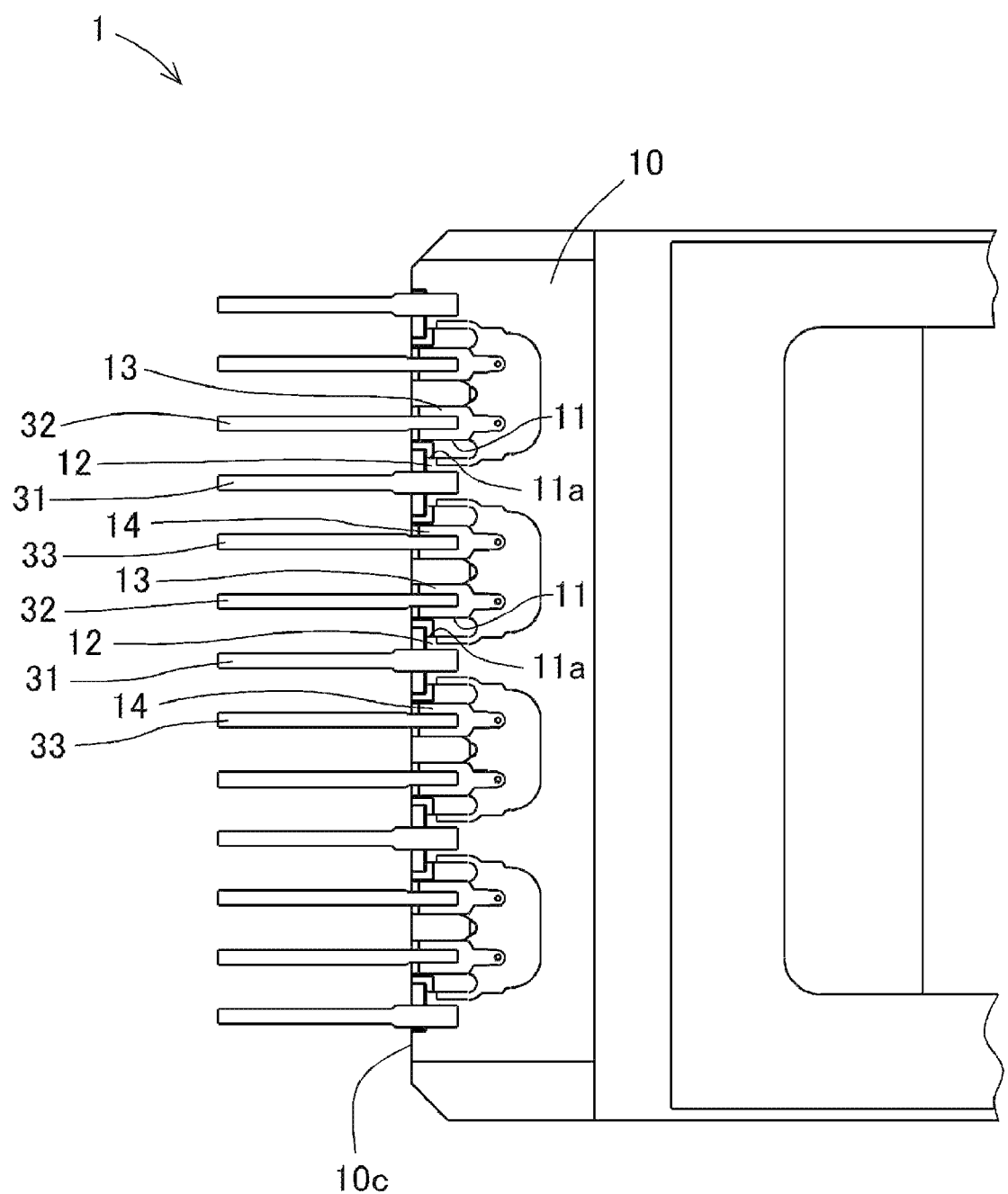
FIG. 2 is an enlarged plan view of the wiring board according to the first embodiment.
Figure 3:
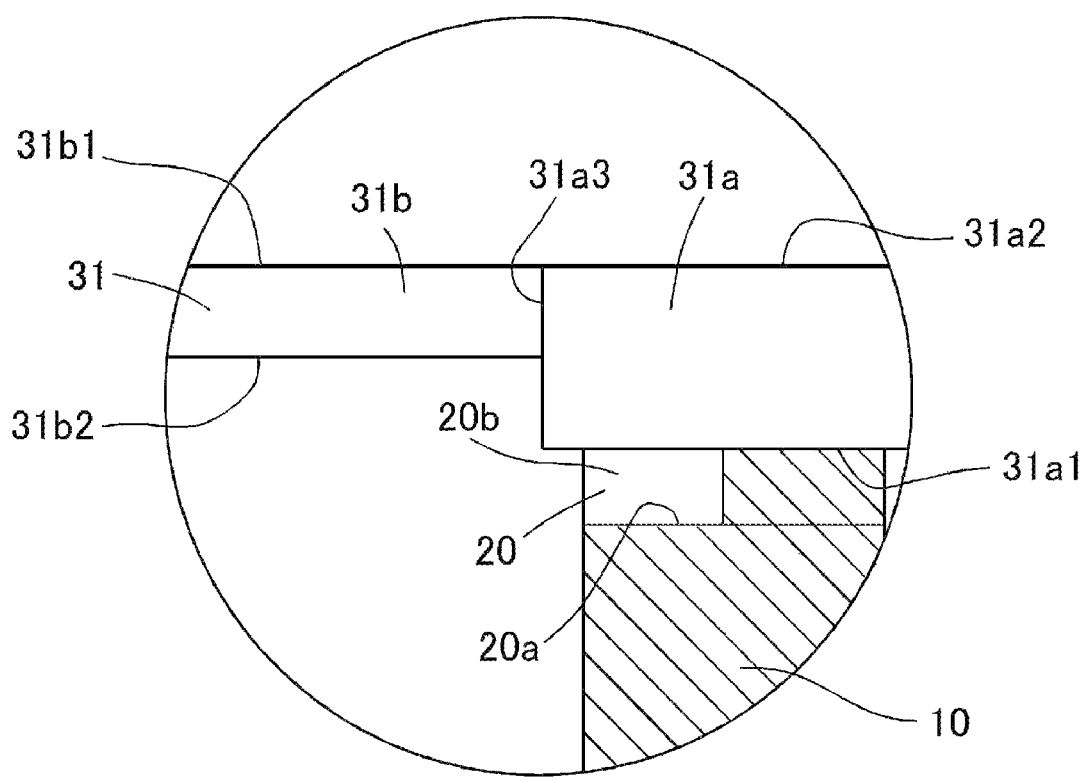
FIG. 3 is an enlarged cross-sectional view of the wiring board according to the first embodiment.
Figure 4:
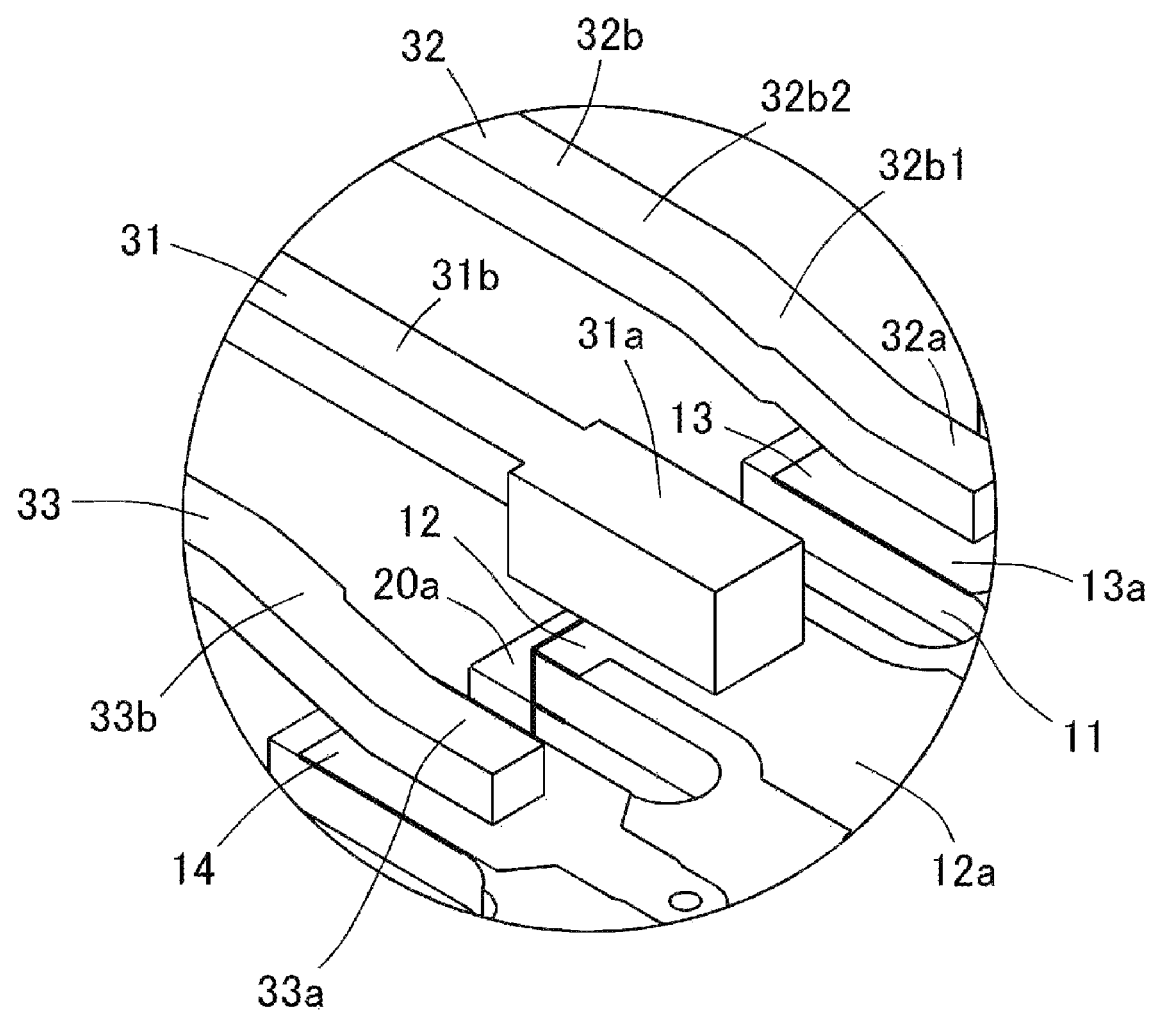
FIG. 4 is an enlarged perspective view of the wiring board according to the first embodiment.

A wiring board, an electronic component package, and an electronic apparatus according to one or more embodiments of the present disclosure will now be described with reference to the drawings. FIG. 1 is a perspective view of a wiring board according to a first embodiment. FIG. 2 is a plan view of the wiring board according to the first embodiment. FIG. 3 is an enlarged cross-sectional view of the wiring board according to the first embodiment. FIG. 4 is an enlarged perspective view of the wiring board according to the first embodiment.

The first embodiment of the present disclosure will now be described with reference to FIGS. 1 to 4. A wiring board 1 includes a dielectric substrate 10, first lead terminals 31, and second lead terminals 32. The dielectric substrate 10 has a first surface 10a, a second surface 10b opposite to the first surface 10a, and a first side surface 10c continuous with the first surface 10a and the second surface 10b.

The dielectric substrate 10 may be a stack of multiple insulating layers formed from a dielectric material. The dielectric substrate 10 may be, for example, rectangular, U-shaped, or in any other shape as viewed from above. Examples of the dielectric material include ceramic materials such as sintered aluminum oxide, sintered mullite, sintered silicon carbide, sintered aluminum nitride, and sintered silicon nitride, or glass ceramic materials.

The first surface 10a includes one or more first terminal joints 12 and one or more second terminal joints 13 arranged along the first side surface 10c. Each first terminal joint 12 is bonded to the corresponding first lead terminal 31 for electrical connection between them. Each second terminal joint 13 is bonded to the corresponding second lead terminal 32 for electrical connection between them. In the present embodiment, for example, the first lead terminals 31 are ground terminals, and the second lead terminals 32 are signal terminals.

The first surface 10a may include multiple first terminal joints 12 and multiple second terminal joints 13 arranged along the first side surface 10c. One or more third terminal joints (described later) may also be multiple third terminal joints. In the present embodiment, for example, each set of a second terminal joint 13, a first terminal joint 12, and a third terminal joint 14 is arranged repeatedly along the first side surface 10c. In the present embodiment, two first terminal joints 12 may extend away from the first side surface 10c and be connected to each other. This stabilizes the ground potential. The stabilized ground potential improves the frequency response for high-frequency signals.

Each first terminal joint 12 may include, for example, a metal layer (hereafter, a first metal layer) 12a for electrical connection to the corresponding first lead terminal. Each second terminal joint 13 may include, for example, a second metal layer 13a for electrical connection to the corresponding second lead terminal. The first metal layers 12a and the second metal layers 13a may be metallization layers formed on the first surface 10a of the dielectric substrate 10. The metallization layers are formed from, for example, a metal material such as tungsten, molybdenum, or manganese, and may be plated with nickel or gold.

The dielectric substrate 10 may include, for example, wiring conductors and conductor layers between the insulating layers. For example, the dielectric substrate 10 may include, as viewed from above, multiple wiring conductors and multiple conductor layers overlapping the first metal layers 12a and the second metal layers 13a, which may be electrically connected with feedthrough conductors. The wiring conductors and the conductor layers include multiple ground wiring conductors and multiple ground conductor layers that are electrically connected to one another and to the first metal layers 12a. The wiring conductors and the conductor layers include multiple signal wiring conductors that are electrically connected to the second metal layers 13a.

Each first lead terminal 31 is bonded to the corresponding first terminal joint 12 with a bond. Each second lead terminal 32 is bonded to the corresponding second terminal joint 13 with a bond. The first lead terminals 31 and the second lead terminals 32 are also connected to, for example, an external mounting board. The first lead terminals 31 and the second lead terminals 32 may be formed from, for example, a metal material. Examples of the metal material include iron, copper, nickel, chromium, cobalt, molybdenum or tungsten, or an alloy of these metals, such as a copper-tungsten alloy, a copper-molybdenum alloy, or an iron-nickel-cobalt alloy.

The bond for bonding the first lead terminals 31 to the first terminal joints 12 and the second lead terminals 32 to the second terminal joints 13 may be, for example, a silver-copper brazing material containing silver and copper as its main components, or a bond with a low melting point (solder) containing silver and copper, and additionally containing tin. Each first lead terminal 31 may be bonded to the corresponding first terminal joint 12 by melting the bond on the first terminal joint 12, placing the first lead terminal 31 on the molten bond, and then cooling and solidifying the molten bond. Each second lead terminal 32 is connected to the corresponding second terminal joint 13 in the same manner.

Each first lead terminal 31 includes a first base 31a bonded to the corresponding first terminal joint 12 and a first lead 31b extending from the first base 31a. Each second lead terminal 32 includes a second base 32a bonded to the corresponding second terminal joint 13 and a second lead 32b extending from the second base 32a. The first lead 31b extends from the first base 31a outwardly from the dielectric substrate 10. The second lead 32b extends from the second base 32a outwardly from the dielectric substrate 10. Each first lead terminal 31 includes the first base 31a having a larger thickness than the first lead 31b. The thickness herein is the dimension perpendicular to the first surface 10a of the dielectric substrate 10.

The lead terminals in the wiring board are bonded to the mounting board and can be under an external force. The lead terminals being narrow and thin may undergo plastic deformation under an external force and can deviate from being horizontal after mounted. The lead terminals being wide and thick can be rigid and may have portions connected with the wiring damaged under an external force and come off together with the wiring. In known wiring boards, such lead terminals can have varying electrical characteristics and thus have deteriorating high-frequency response.

In the present embodiment, each first lead terminal 31 includes two portions with different thicknesses, of which the first base 31a bonded to the first terminal joint 12 is thicker. The first base 31a that is thicker allows the entire lead terminal to be sufficiently rigid, whereas the first lead 31b that is thinner is flexible and can deform elastically. This structure reduces the likelihood of the wiring board 1 being inclined during mounting and allows the wiring board 1 to be closer to being horizontal. This structure thus reduces the likelihood of the wiring board 1 being damaged. The lead terminals are less likely to have varying electrical characteristics and improve the high-frequency response of the wiring board 1.

Each second lead terminal 32 includes the second base 32a and the second lead 32b with the same thickness and the same width. Each second lead terminal 32 is thus entirely band-shaped. The second base 32a is a linear portion extending parallel to the first surface 10a and bonded to the second terminal joint 13. The second lead 32b includes a bent portion 32b1 that is continuous with the second base 32a and extends away from the dielectric substrate 10 outwardly, and a straight portion 32b2 that is continuous with the bent portion 32b1 and extends parallel to the second base 32a. The first base 31a in each first lead terminal 31 may have a larger thickness than the second base 32a in each second lead terminal 32.

The first base 31a and the first lead 31b may have the same width or may have different widths. In the present embodiment, the first base 31a may have a larger width than the first lead 31b. The width herein is the dimension perpendicular to the thickness and to the direction in which the lead extends. The first lead 31b is directly bonded to the mounting board. As the width of the first lead 31b is smaller, the wiring on the mounting board can have a smaller width and can be denser. The first base 31a contributes to the rigidity of the first lead terminal 31. The first base 31a having a smaller width similarly to the first lead 31b can lower the rigidity of the first lead terminal 31. The first base 31a thus has a larger width than the first lead 31b to appropriately increase the rigidity of the entire lead terminal. For example, the first lead terminals 31 are ground terminals, and the second lead terminals 32 are signal terminals. The ground wiring and the signal wiring may both have the same wiring width on the mounting board. In this case, the first lead 31b and the second lead 32b may have the same width. Each second lead terminal 32 includes the second base 32a and the second lead 32b with the same width. The first base 31a may have a larger width than the second base 32b.

The dielectric substrate 10 may have cutouts 11 that are open at the first surface 10a and at the first side surface 10c. Each cutout 11 is located between the first terminal joint 12 and the second terminal joint 13 and defines a space to improve electrical insulation between the first terminal joint 12 and the second terminal joint 13. Also, cutouts similar to the cutouts 11 may be formed between second terminal joints 13.

The cutouts 11 may have any shape but are rectangular and each have two facing inner surfaces parallel to each other in the present embodiment. The cutouts 11 may be, for example, tapered or flared and may each have two facing inner surfaces that are not parallel to each other.

The dielectric substrate 10 may further include ground conductor layers 11a covering the inner surfaces of the cutouts 11. The ground conductor layers 11a may be, for example, metallization layers formed on the inner surfaces of the cutouts 11. The metallization layer is formed from, for example, a metal material such as tungsten, molybdenum, or manganese, and may be plated with nickel or gold. The ground conductor layers 11a are electrically connected to, for example, the ground wiring conductors, the ground conductor layers, or the first terminal joints 12 (first metal layers 12a) in the dielectric substrate 10 to further stabilize the ground potential.

In the present embodiment, each first terminal joint 12 may include a step 20 defined in a portion adjacent to the first side surface 10c and recessed toward the second surface 10b. For example, the first terminal joint 12 includes a rectangular portion 20a continuous with the first side surface 10c and located one step (equivalent to, for example, a single insulating layer) closer to the second surface 10b than the other portion. The first metal layer 12a is located on the step 20. The step 20 includes the rectangular portion 20a and a wall surface 20b between the rectangular portion 20a and the other portion. The first metal layer 12a is also located on the wall surface 20b. The wall surface 20b increases the area of the first terminal joint 12, or more specifically the first metal layer 12a, in the structure including the step 20 more than in the structure without the step 20. The step 20 thus stabilizes the ground potential further.

The step 20 is rectangular in the present embodiment, but may be in another polygonal shape or may be semicircular. The step 20 with such a shape also has the wall surface that increases the area of the first terminal joint 12, thus stabilizing the ground potential further.

In the present embodiment, for example, the first base 31a is either rectangular or prismatic, and the first lead 31b continuous with the end of the first base 31a has a smaller thickness than the first base 31a, is band-shaped, and extends outwardly. As described above, the first base 31a is bonded to the first terminal joint 12 with a bond. The first base 31a overlaps the step 20 as viewed from above. The first base 31a may partially overlap the rectangular portion 20a as viewed from above. The portion of the first base 31a overlapping the rectangular portion 20a is spaced from the rectangular portion 20a. When each first lead terminal 31 is connected to the corresponding first terminal joint 12, the molten bond enters the space and solidifies to form a fillet of the bond. This improves the bonding strength between the first lead terminal 31 and the first terminal joint 12.

The first base 31a may overlap the step 20 as viewed from above, and may have an end adjacent to the first lead 31b located outwardly from the first side surface 10c. The end of the first base 31a opposite to the first lead 31b is bonded to the other portion of the first terminal joint 12 excluding the step 20. The first base 31a extends across the rectangular portion 20a as viewed from above, and is firmly bonded to the first terminal joint 12 with the bond entering the entire portion overlapping the rectangular portion 20a.

For the connection between the first base 31a and the first lead 31b, the first lead 31b may be connected to the end of the first base 31a at any position in the thickness direction. In the present embodiment, the first lead 31b is connected to the end of the first base 31a at a position most distant from the first terminal joint 12 in the thickness direction. More specifically, the first base 31a has a base first surface 31a1 adjacent to the first terminal joint 12 and a base second surface 31a2 opposite to and parallel to the base first surface 31a1. The first lead 31b has a lead first surface 31b1 flush with the base second surface 31a2. The first lead 31b has a lead second surface 31b2 parallel to the lead first surface 31b1. The lead second surface 31b2 is orthogonal to an end face 31a3 of the first base 31a. In the present embodiment, as shown in FIG. 3, the end (end face 31a3) of the first base 31a adjacent to the first lead 31b is located outwardly from the first side surface 10c.

In the present embodiment, the wiring board 1 may further include third lead terminals 33. The first surface 10a of the dielectric substrate 10 includes, opposite to the second terminal joint 13 across each first terminal joint 12, a third terminal joint 14 that is bonded to the third lead terminals 33 with a bond. Similarly to the second lead terminals 32, the third lead terminals 33 are signal terminals. The first lead terminal 31 as a ground terminal is located between each second lead terminal 32 and the corresponding third lead terminal 33. Each third lead terminal 33 includes a third base 33a bonded to the third terminal joint 14 and a third lead 33b extending from the third base 33a. The first base 31a has a larger thickness than the third base 33a, similarly to the second base 32a.

The second lead terminals 32 and the third lead terminals 33 are both signal terminals. When these terminals are electromagnetically coupled to each other, an electrical signal transmitted through one terminal affects an electrical signal transmitted through the other terminal. This noise phenomenon is called crosstalk. The second lead 32b and the third lead 33b are weakly coupled to each other electromagnetically with air as the dielectric being between the leads. In contrast, the second base 32a and the third base 33a can be strongly coupled to each other electromagnetically with the dielectric substrate 10 between the bases. Noise from crosstalk is thus more likely to occur between the second base 32a and the third base 33a. The first lead terminals 31 are ground terminals. The first base 31a of each first lead terminal 31 between the corresponding second base 32a and third base 33a has a larger thickness than the second base 32a and the third base 33a. The third base 33a electromagnetically insulates between the second base 32a and the third base 33a, causing the bases to be weakly coupled to each other electromagnetically and thus reducing crosstalk.

The third lead terminal 33 may have the same shape as or a different shape from the second lead terminal 32. The third lead terminals 33 may be formed from the same metal material as or a different material from the second lead terminals 32. In the present embodiment, the third lead terminals 33 and the second lead terminals 32 are formed from the same material and have the same shape.

Figure 5:
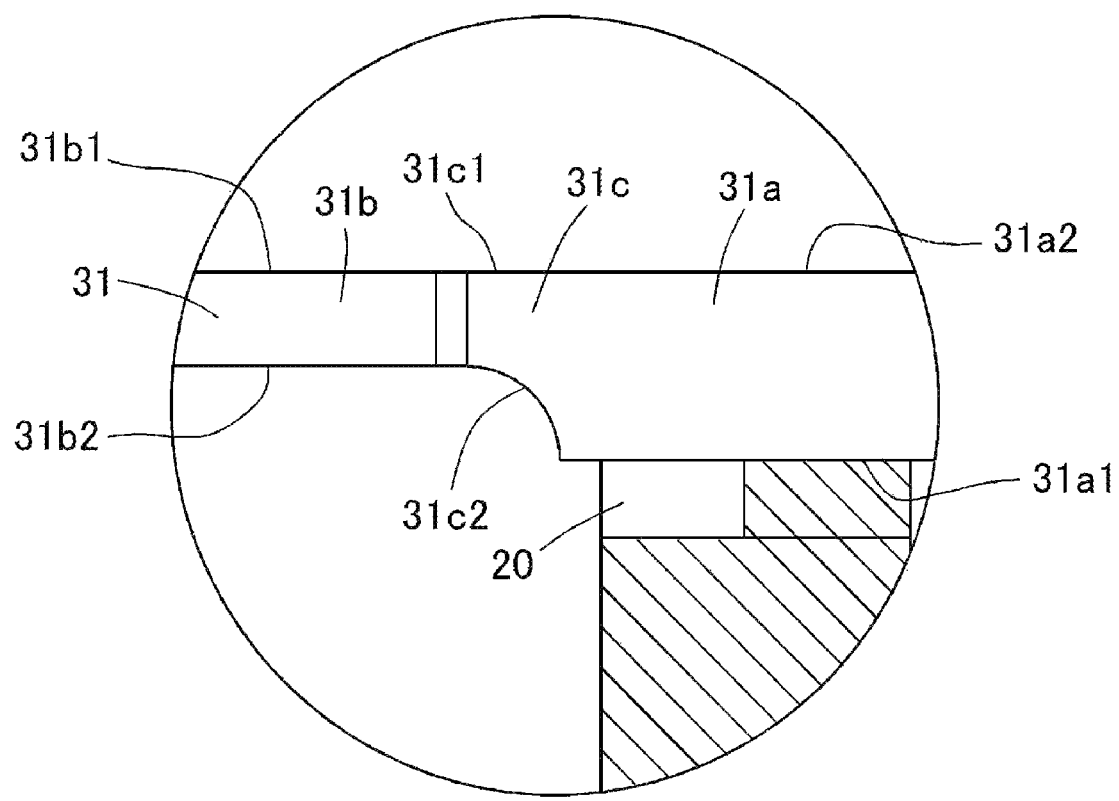
FIG. 5 is an enlarged cross-sectional view of a wiring board according to a second embodiment.
Figure 6:
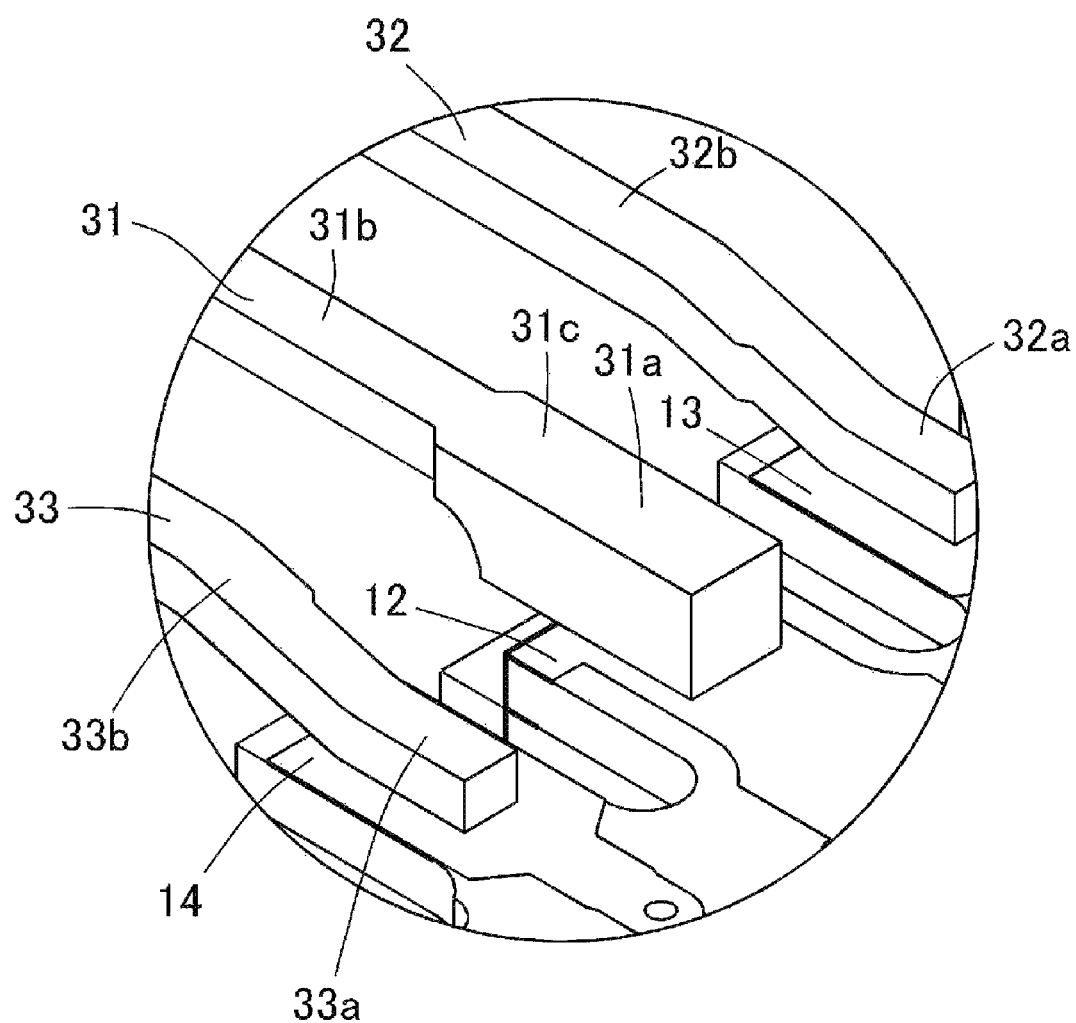
FIG. 6 is an enlarged perspective view of the wiring board according to the second embodiment.

A second embodiment will now be described. FIG. 5 is an enlarged cross-sectional view of a wiring board according to the second embodiment. FIG. 6 is an enlarged perspective view of the wiring board according to the second embodiment. The present embodiment is the same as the first embodiment except the structure of the first lead terminals 31. The same components as in the first embodiment are given the same reference numerals and will not be described in detail.

Each first lead terminal 31 includes, between a first base 31a and a first lead 31b, a joint 31c connecting the first base 31a and the first lead 31b. The joint 31c has either an inclined surface or a curved surface continuous with one surface of the first base 31a and one surface of the first lead 31b. In the present embodiment, for example, the joint 31c has a curved surface. The joint 31c has a joint first surface 31c1 flush with a base second surface 31a2 and a lead first surface 31b1. The joint 31c has a joint second surface 31c2 continuous with the base first surface 31a1 of the first base 31a and the lead second surface 31b2 of the first lead 31b. The joint second surface 31c2 is a curved surface. Although each first lead terminal 31 may be under an external force applied to the lead first surface 31b1 during bonding to the mounting board, the stress is distributed, thus reducing damage between the first base 31a and the first lead 31b. The joint second surface 31c2 may be inclined to produce the same advantageous effects as the curved surface.

Figure 7:
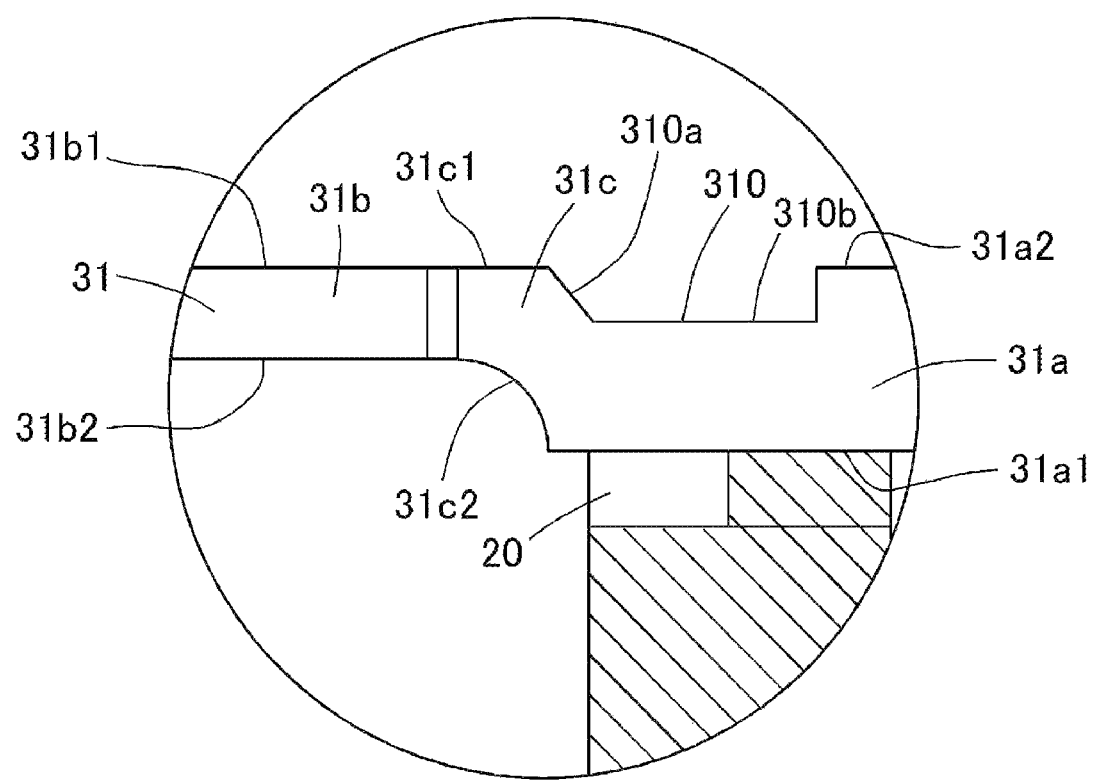
FIG. 7 is an enlarged cross-sectional view of a wiring board according to a third embodiment.
Figure 8:
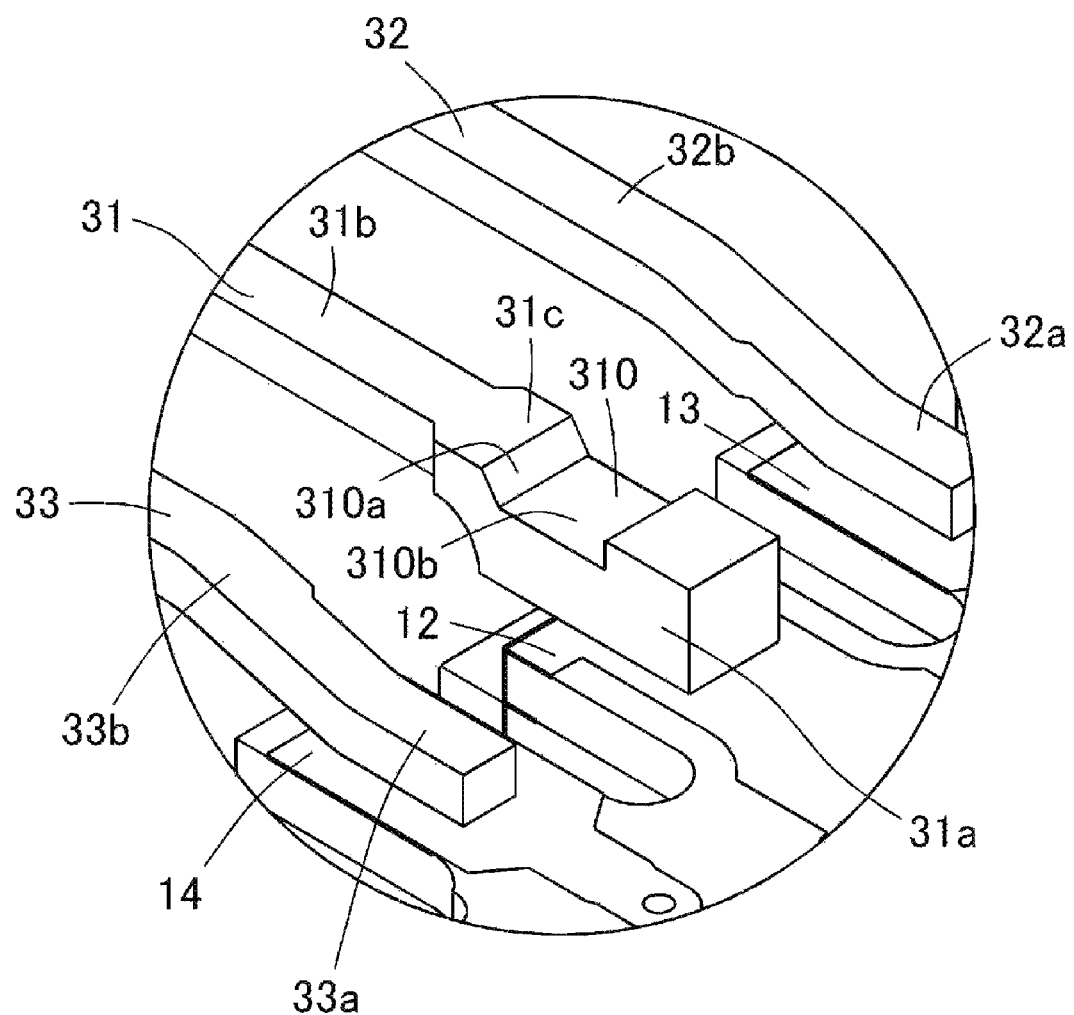
FIG. 8 is an enlarged perspective view of the wiring board according to the third embodiment.

A third embodiment will now be described. FIG. 7 is an enlarged cross-sectional view of a wiring board according to the third embodiment. FIG. 8 is an enlarged perspective view of the wiring board according to the third embodiment. The present embodiment is the same as the second embodiment except the structure of the first lead terminals 31. The same components as in the second embodiment are given the same reference numerals and will not be described in detail.

Each first lead terminal 31 in the present embodiment has a recess 310 on a base second surface 31a2 of a first base 31a. The recess 310 is a portion of the base second surface 31a2 that is recessed toward the base first surface 31a1. The recess 310 may be a portion of the base second surface 31a2 that is cut out from the base first surface 31a1. The recess 310 on the base second surface 31a2 lowers the effective relative dielectric constant and improves the high-frequency response.

The recess 310 in the present embodiment has one end adjacent to the joint 31c located at the boundary between the first base 31a and the joint 31c. This structure reduces a load from the stress applied at the boundary between the first base 31a and the joint 31c. The recess 310 in the present embodiment includes an inner wall 310a extending from the boundary between the first base 31a and the joint 31c to its bottom surface. The inner wall 310a is inclined with respect to the base first surface 31a1 and with respect to a bottom surface 310b of the recess 310. The inner wall 310a may be inclined with respect to the base second surface 31a2. This structure allows the lead terminals to maintain rigidity and reduce a load from the stress applied. This structure thus improves the high-frequency response of the wiring board 1.

An example method for manufacturing the wiring board 1 will now be described. The dielectric substrate 10 including multiple insulating layers formed from, for example, sintered aluminum oxide may be prepared in the manner described below. An aluminum oxide-containing powdery raw material and a silicon oxide-containing powdery raw material are mixed with, for example, an appropriate organic binder and an appropriate solvent to form slurry. The slurry is then shaped into sheets using, for example, the doctor blade method, to yield multiple ceramic green sheets.

The ceramic green sheets are then stacked on one another and pressure-bonded. The stacked ceramic green sheets are then fired in a reducing atmosphere, and cut or punched into an appropriate shape to complete the dielectric substrate 10 with an intended shape.

The first metal layers 12a, the second metal layers 13a, the ground conductors, and the signal conductors are formed from, for example, metallization layers that may be formed from a metal having a high melting point, such as tungsten, molybdenum, or manganese, prepared in the manner described below. A metal powder with a high melting point is kneaded with an organic solvent and a binder fully into a metal paste. The metal paste is then printed at predetermined positions on the ceramic green sheets to be the upper and lower surfaces of the insulating layers by, for example, screen printing. These ceramic green sheets with a printed metal paste are stacked on one another, pressure-bonded, and then co-fired. Through the above process, the metallization layer is deposited on the upper surface and the inner layer of the dielectric substrate 10 as the first metal layers 12a, the second metal layers 13a, the ground conductors, and the signal conductors. The first metal layer 12a, the second metal layer 13a, and the conductor layers may be plated with nickel or gold.

The feedthrough conductors are prepared by, for example, forming through-holes in multiple ceramic green sheets to be the insulating layers, and filling the through-holes with a metal paste similar to the metal paste used to form the conductor layers. The ceramic green sheets are then stacked on one another, pressure-bonded, and then co-fired to form the feedthrough conductors. The through-holes can be formed by, for example, die machining using a metal pin, or punching, for example, with laser. The filling of the through-holes with the metal paste may be facilitated with, for example, vacuum suction.

The first lead terminals 31, the second lead terminals 32, and the third lead terminals 33 may then be prepared by processing (e.g., rolling or punching) an ingot formed from such a metal material. The first lead terminals 31, the second lead terminals 32, and the third lead terminals 33 are then bonded to the first terminal joints 12, the second terminal joints 13, and the third terminal joints 14 in the dielectric substrate 10 with a bond to complete the wiring board 1.

Figure 9:
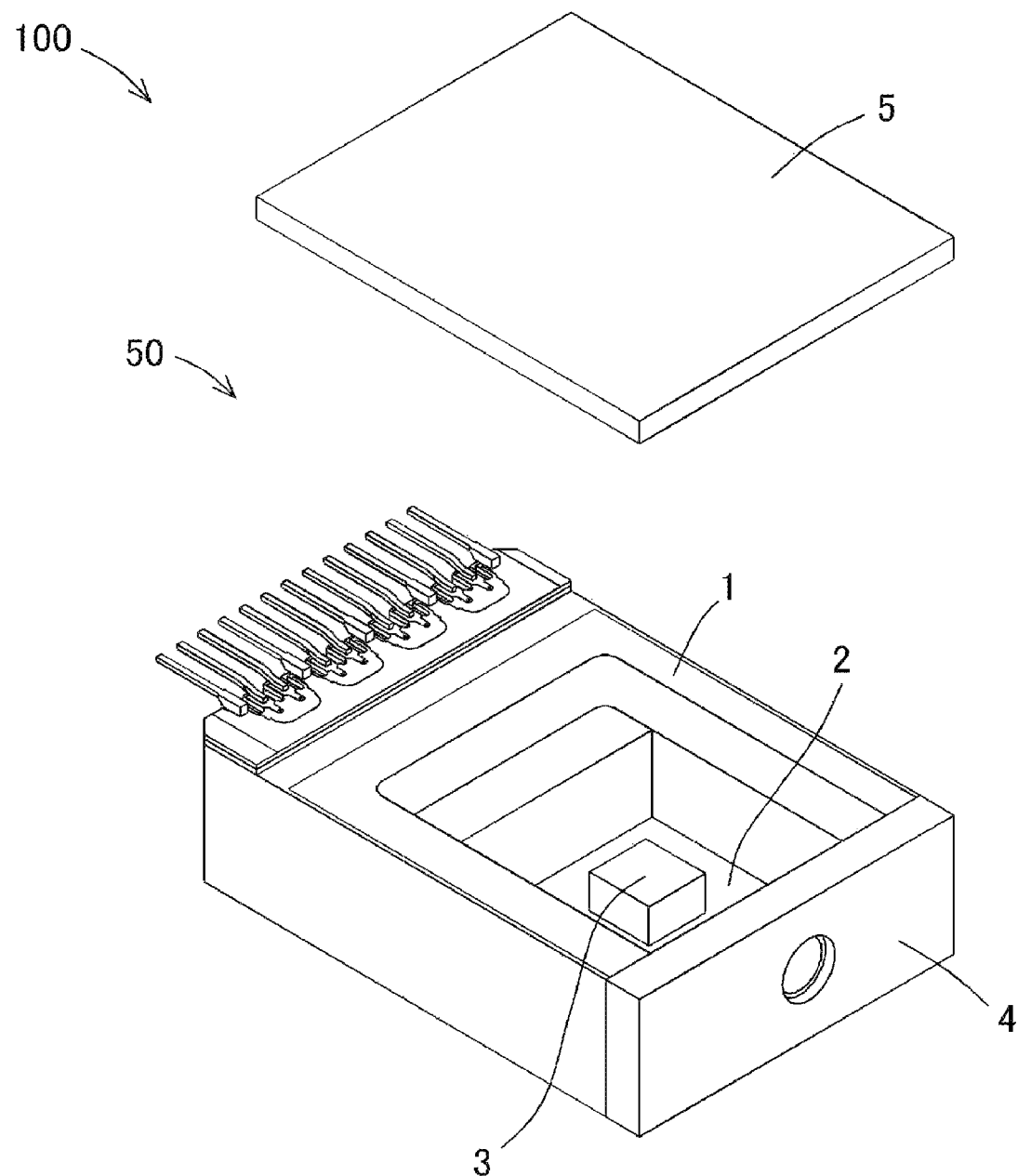
FIG. 9 is a perspective view of an electronic component package and an electronic apparatus according to another embodiment.

FIG. 9 is a perspective view of an electronic component package and an electronic apparatus according to another embodiment of the present disclosure. An electronic component package 50 includes a substrate 2 and the wiring board 1 bonded to the substrate 2. In the present embodiment, the wiring board 1 is U-shaped and is attached to a sidewall 4 to form a frame, which is then bonded to the surface of the substrate 2. The substrate 2 and the sidewall 4 may be formed from, for example, a metal such as iron, copper, nickel, chromium, cobalt, molybdenum or tungsten, or an alloy of these metals, such as a copper-tungsten alloy, a copper-molybdenum alloy, or an iron-nickel-cobalt alloy. The metal member for the substrate 2 and the sidewall 4 may be prepared by processing (e.g., rolling or punching) an ingot formed from such a metal material.

An electronic apparatus 100 includes the electronic component package 50, an electronic component 3 mounted on the substrate 2 and electrically connected to the wiring board 1, and a lid 5.

The electronic component 3 may be, for example, an optical semiconductor device such as a laser diode (LD) or a photodiode (PD). For an LD, the sidewall 4 may have a through-hole 40 to receive an optical fiber. The lid 5 is bonded to the upper edges of the wiring board 1, which is a frame, and the sidewall 4 to cover the electronic component package 50. The lid 5 may be formed from, for example, a metal such as iron, copper, nickel, chromium, cobalt, molybdenum or tungsten, or an alloy of these metals, such as a copper-tungsten alloy, a copper-molybdenum alloy, or an iron-nickel-cobalt alloy. The metal member for the lid 5 may be prepared by processing (e.g., rolling or punching) an ingot formed from such a metal material.

The electronic component 3 is mounted inside the electronic component package 50, and is electrically connected to the wiring board 1 with, for example, bonding wires. The electronic component 3 is then sealed with the lid 5.

The present invention is not limited to the above embodiments, and the embodiments may be combined and changed variously without departing from the spirit and scope of the present invention. For example, the electronic component package 50 and the electronic apparatus 100 may include the wiring board 1 according to any of the above embodiments or combining any features in the embodiments. Modifications contained in the claims can fall within the scope of the present invention.

REFERENCE SIGNS LIST 1 wiring board
2 substrate 3 electronic component
4 sidewall
5 lid
10 dielectric substrate
10a first surface
10b second surface
10c first side surface
11 cutout
12 first terminal joint
12a first metal layer
13 second terminal joint
13a second metal layer
14 third terminal joint
20 step
20a rectangular portion
20b wall surface
31 first lead terminal
31a first base
31a1 base first surface
31a2 base second surface
31a3 end face
31b first lead
31b1 lead first surface
31b2 lead second surface
31c joint
31c1 joint first surface
31c2 joint second surface
32 second lead terminal
32a second base
32b second lead
32b1 bent portion
32b2 straight portion
33 third lead terminal
33a third base
33b third lead
40 through-hole
50 electronic component package
100 electronic apparatus
310 recess
310a inner wall
310b bottom surface

The invention claimed is:

1. A wiring board, comprising:
a dielectric substrate;
a first lead terminal; and
a second lead terminal,
wherein the dielectric substrate has a first surface, a second surface opposite to the first surface, and a first side surface continuous with the first surface and the second surface,
the first surface includes a first terminal joint and a second terminal joint arranged along the first side surface,
the first lead terminal includes a first base bonded to the first terminal joint and a first lead extending from the first base,
the second lead terminal includes a second base bonded to the second terminal joint and a second lead extending from the second base,
the second lead includes a bent portion that extends away from the dielectric substrate and is continuous with the second base, and a straight portion that is continuous with the bent portion and extends parallel to the second base, and
the first base has a larger thickness than the first lead.

2. The wiring board according to claim 1, wherein the first base has a larger thickness than the second base.

3. The wiring board according to claim 1, wherein the first base has a larger width than the first lead.

4. The wiring board according to claim 3, wherein the first base has a larger width than the second base.

5. The wiring board according to claim 1, wherein
the first base has a base first surface adjacent to the first terminal joint and a base second surface parallel to the base first surface, and
the first lead has a lead first surface flush with the base second surface.

6. The wiring board according to claim 5, wherein the first base includes a recess on the base second surface.

7. The wiring board according to claim 6, wherein
the recess includes an inner wall adjacent to a boundary between the first base and the joint, and
the inner wall is inclined with respect to the base first surface.

8. The wiring board according to claim 5, wherein
the first lead terminal further includes a joint between the first base and the first lead,
the joint has an inclined surface or a curved surface continuous with a surface of the first base and a surface of the first lead,
the first base includes a recess on the base second surface, and
the recess includes an end located at a boundary between the first base and the joint.

9. The wiring board according to claim 1, wherein the first lead terminal is a ground terminal.

10. The wiring board according to claim 9, further comprising:
a third lead terminal,
wherein the second lead terminal and the third lead terminal are signal terminals,
the first surface includes a third terminal joint located opposite to the second terminal joint across the first terminal joint,
the third lead terminal includes a third base bonded to the third terminal joint and a third lead extending from the third base, and
the first base has a larger thickness than the third base.

11. The wiring board according to claim 1, wherein the dielectric substrate includes
a cutout open at the first surface and the first side surface and located between the first terminal joint and the second terminal joint, and
a conductor layer located on an inner surface of the cutout and continuous with the first terminal joint.

12. An electronic component package, comprising:
a substrate; and
the wiring board according to claim 1 bonded to the substrate.

13. An electronic apparatus, comprising:
the electronic component package according to claim 12; and
an electronic component mounted on the substrate and electrically connected to the wiring board.

14. The wiring board according to claim 1, wherein the first base extends past the first terminal joint in a direction away from the dielectric substrate.

15. A wiring board, comprising:
a dielectric substrate;
a first lead terminal; and
a second lead terminal, wherein the dielectric substrate has a first surface, a second surface opposite to the first surface, and a first side surface continuous with the first surface and the second surface, the first surface includes a first terminal joint and a second terminal joint arranged along the first side surface, the first lead terminal includes a first base bonded to the first terminal joint and a first lead extending from the first base, the second lead terminal includes a second base bonded to the second terminal joint and a second lead extending from the second base, the first terminal joint includes a step defined in a portion of the first side surface and recessed toward the second surface, and the first base overlaps the step as viewed from above.

16. The wiring board according to claim 15, wherein the first base includes an end adjacent to the first lead and located outward from the first side surface as viewed from above.

17. A wiring board, comprising:
a dielectric substrate;
a first lead terminal; and
a second lead terminal,
wherein the dielectric substrate has a first surface, a second surface opposite to the first surface, and a first side surface continuous with the first surface and the second surface, the first surface includes a first terminal joint and a second terminal joint arranged along the first side surface, the first lead terminal includes a first base bonded to the first terminal joint, a first lead extending from the first base, and a joint between the first base and the first lead, the second lead terminal includes a second base bonded to the second terminal joint and a second lead extending from the second base, and the first lead terminal further includes a joint between the first base and the first lead, and the joint has an inclined surface or a curved surface continuous with a surface of the first base and a surface of the first lead.

\* \* \* \* \*